US010428425B2

(12) United States Patent
Oyama et al.

(10) Patent No.: US 10,428,425 B2
(45) Date of Patent: Oct. 1, 2019

(54) FILM DEPOSITION APPARATUS, METHOD OF DEPOSITING FILM, AND NON-TRANSITORY COMPUTER-READABLE RECORDING MEDIUM

(71) Applicant: Tokyo Electron Limited, Tokyo (JP)

(72) Inventors: Katsuhiko Oyama, Iwate (JP); Kiichi Takahashi, Iwate (JP); Yasushi Takeuchi, Iwate (JP); Katsuyoshi Aikawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 15/413,600

(22) Filed: Jan. 24, 2017

(65) Prior Publication Data

US 2017/0211181 A1    Jul. 27, 2017

(30) Foreign Application Priority Data

Jan. 26, 2016  (JP) ................................. 2016-012074
Dec. 13, 2016  (JP) ................................. 2016-241584

(51) Int. Cl.
| | | |
|---|---|---|
| *C23C 16/40* | (2006.01) |
| *B23B 31/11* | (2006.01) |
| *G06K 5/00* | (2006.01) |
| *B25B 13/46* | (2006.01) |
| *B25B 27/00* | (2006.01) |

(Continued)

(52) U.S. Cl.
CPC .... *C23C 16/4584* (2013.01); *C23C 16/45551* (2013.01)

(58) Field of Classification Search
CPC .......... C23C 16/4584; C23C 16/45551; B23B 31/117; B23B 31/1175; B23B 31/1177; B23B 31/1179; B25B 13/463; B25B 27/005; B25B 27/0057; G06K 5/00
USPC ............... 118/730; 156/345.55; 279/96, 102; 269/203; 427/248.1; 700/1, 90, 121
See application file for complete search history.

(56) References Cited

U.S. PATENT DOCUMENTS 3,783,822 A * 1/1974 Wollam .............. C23C 16/4584
                                                      118/725
5,226,383 A * 7/1993 Bhat ................... C23C 16/4584
                                                      118/500

(Continued)

FOREIGN PATENT DOCUMENTS

JP     2010-206025     9/2010

*Primary Examiner* — Rudy Zervigon
(74) *Attorney, Agent, or Firm* — IPUSA, PLLC

(57) ABSTRACT

A film deposition apparatus for sequentially supplying reaction gases, which mutually react, into a chamber to deposit a film on a substrate includes a turntable rotatable and including a concave portion on an upper surface, a bottom portion of the concave portion having a through hole, a substrate supporting member attachable to and detachable from the concave portion, an upper surface of the substrate supporting member mounting the substrate, a lower surface of the substrate supporting member having a first protruding portion, a drive mechanism moving up and down the turntable and revolving the turntable, a lid member located lower than the turntable, an upper surface of the lid member having a second protruding portion, and a control unit revolving the turntable to cause the first protruding portion to contact the second protruding portion and cause the substrate supporting member to be spun a predetermined angle relative to the turntable.

20 Claims, 11 Drawing Sheets

(51) Int. Cl.
*C23C 16/458* (2006.01)
*C23C 16/455* (2006.01)

(56) References Cited

U.S. PATENT DOCUMENTS

| | | | | |
|---|---|---|---|---|
| 5,527,393 | A * | 6/1996 | Sato | C23C 16/45521 118/500 |
| 5,683,518 | A * | 11/1997 | Moore | C23C 16/4404 118/50.1 |
| 5,782,979 | A * | 7/1998 | Kaneno | C23C 16/301 118/500 |
| 5,788,777 | A * | 8/1998 | Burk, Jr. | C23C 16/4584 118/730 |
| 6,506,252 | B2 * | 1/2003 | Boguslavskiy | C23C 16/4584 117/107 |
| 6,569,250 | B2 * | 5/2003 | Paisley | C23C 16/325 118/730 |
| 6,726,769 | B2 * | 4/2004 | Boguslavskiy | C23C 16/4584 117/200 |
| 6,811,614 | B2 * | 11/2004 | Kappeler | C23C 16/4584 117/901 |
| 6,837,940 | B2 * | 1/2005 | Komeno | C23C 16/4581 118/730 |
| 7,368,018 | B2 * | 5/2008 | Yamaguchi | C23C 16/4584 118/730 |
| 8,052,794 | B2 * | 11/2011 | Sumakeris | C23C 16/45514 117/83 |
| 8,679,254 | B2 * | 3/2014 | Iso | C30B 29/403 118/715 |
| 8,721,790 | B2 * | 5/2014 | Kato | C23C 16/4412 118/715 |
| 8,746,170 | B2 * | 6/2014 | Orito | C23C 16/45502 118/663 |
| 8,845,857 | B2 * | 9/2014 | Ohizumi | C23C 16/45546 118/728 |
| 8,951,347 | B2 * | 2/2015 | Kato | C23C 16/45519 118/715 |
| 9,111,747 | B2 * | 8/2015 | Yamawaku | H01L 21/02104 |
| 9,435,026 | B2 * | 9/2016 | Wamura | C23C 16/4401 |
| 9,567,673 | B2 * | 2/2017 | Park | C23C 16/45551 |
| 9,988,717 | B2 * | 6/2018 | Honma | C23C 16/45548 |
| 10,221,480 | B2 * | 3/2019 | Kato | C23C 16/402 |
| 2002/0106826 | A1 * | 8/2002 | Boguslavskiy | C23C 16/4584 438/44 |
| 2003/0029384 | A1 * | 2/2003 | Nishikawa | C23C 16/4584 118/730 |
| 2004/0211365 | A1 * | 10/2004 | Yamaguchi | C23C 16/4584 118/728 |
| 2010/0050943 | A1 * | 3/2010 | Kato | C23C 16/401 118/730 |
| 2010/0055297 | A1 * | 3/2010 | Kato | C23C 16/45551 427/8 |
| 2010/0055315 | A1 * | 3/2010 | Honma | C23C 16/45551 427/255.28 |
| 2010/0151131 | A1 * | 6/2010 | Obara | C23C 16/4412 427/255.28 |
| 2010/0200545 | A1 * | 8/2010 | Koelmel | C23C 16/4584 216/58 |
| 2011/0114022 | A1 * | 5/2011 | Boguslavskiy | C23C 16/45508 118/724 |
| 2011/0300297 | A1 * | 12/2011 | Celaru | C23C 16/4584 427/255.5 |
| 2012/0145080 | A1 * | 6/2012 | Park | C23C 16/4412 118/725 |
| 2013/0125820 | A1 * | 5/2013 | Yin | C23C 16/458 118/730 |
| 2013/0255578 | A1 * | 10/2013 | Sakong | H01L 21/02104 118/725 |
| 2013/0298836 | A1 * | 11/2013 | Ikenaga | C23C 16/4584 118/730 |
| 2013/0324012 | A1 * | 12/2013 | Fukushima | B24B 37/005 451/1 |
| 2015/0203965 | A1 * | 7/2015 | Enomoto | C23C 16/4584 438/758 |
| 2015/0240357 | A1 * | 8/2015 | Tachibana | C23C 16/4584 118/725 |
| 2016/0138159 | A1 * | 5/2016 | Kato | C23C 16/4584 |
| 2017/0287770 | A1 * | 10/2017 | Gangakhedkar | C23C 16/45544 |

* cited by examiner

94

94

FILM DEPOSITION APPARATUS, METHOD OF DEPOSITING FILM, AND NON-TRANSITORY COMPUTER-READABLE RECORDING MEDIUM

CROSS-REFERENCE TO RELATED APPLICATIONS

This patent application is based upon and claims the benefit of priority of Japanese Patent Application No. 2016-012074 filed on Jan. 26, 2016 and Japanese Patent Application No. 2016-241584 filed on Dec. 13, 2016, the entire contents of which are incorporated herein by reference.

BACKGROUND OF THE INVENTION

1. Field of the Invention

The present invention relates to a film deposition apparatus, a method of depositing a film, and a non-transitory computer-readable recording medium.

2. Description of the Related Art

In one example of a film deposition apparatus, multiple substrates are mounted on a turntable provided inside a vacuum chamber in a rotational direction of the turntable, and a process gas is supplied from a gas supplying portion disposed along the radius direction of the turntable while rotating the turntable to deposit a film on the substrate.

This film deposition apparatus may cause unbalance in the thickness of a film depositing on the substrate depending on a gas flow inside the vacuum chamber, a temperature distribution of the turntable, or the like. Especially, because the turntable performs a circular motion around its revolving shaft, the imbalance is apt to occur between sides nearer to and farther from the rotational center of the turntable.

Then, according to a conventional technique, a tray is provided at the position on the turntable where a substrate is mounted, and the tray is turned (spun) by a driving apparatus provided outside the vacuum chamber in addition to turning (orbital motion) of the turntable to make the film thickness uniform (for example, see Patent Document 1).

[Patent Document 1] Japanese Laid-open Patent Publication No. 2010-206025

However, according to the above technique, it is structured to rotate the tray from the outside of the vacuum chamber. Therefore, a mechanism for rotating the tray becomes complicated.

Therefore, required is the film deposition apparatus which has a simple structure, and can cause the substrate to be rotated relative to the turntable to improve the film thickness evenness in a film depositing on the substrate.

SUMMARY OF THE INVENTION

Accordingly, embodiments of the present invention may provide a new and useful film deposition apparatus and a method of depositing a film.

Specifically, the film deposition apparatus for sequentially supplying at least two reaction gases, which mutually react, into a chamber to deposit a film on a substrate includes a turntable configured to be rotatable and include a concave portion on an upper surface, a bottom portion of the concave portion having a through hole; a substrate supporting member configured to be attachable to and detachable from the concave portion, an upper surface of the substrate supporting member being configured to mount the substrate, a lower surface of the substrate supporting member being configured to have a first protruding portion, a drive mechanism configured to move up and down the turntable and revolve the turntable, a lid member located inside the chamber and lower than the turntable, an upper surface of the lid member having a second protruding portion, and a control unit configured to, after the drive mechanism moves down the turntable, revolve the turntable to cause the first protruding portion to contact the second protruding portion and cause the substrate supporting member to move to be spun a predetermined angle relative to the turntable.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

A description is given below, with reference to the FIG. 1 through FIG. 12 of the embodiment of the present invention.

Through all figures illustrating the embodiments, the same references symbols are used for portions having the same function, and repetitive explanations of these portions are omitted.

In the embodiments described below, the reference symbols typically designate as follows:

1: vacuum chamber;
2: turntable;
2a: concave portion;
7: heater unit;
7a: lid member;
16: bellows;
23: driving unit;
91: substrate supporting member;
91a: mounting portion;
92: flange portion;
93: first protruding portion;
94: bearing;
95: second protruding portion;
96: slip seat;
100: control unit; and
W: wafer

[Film Deposition Apparatus]

Figure 1:
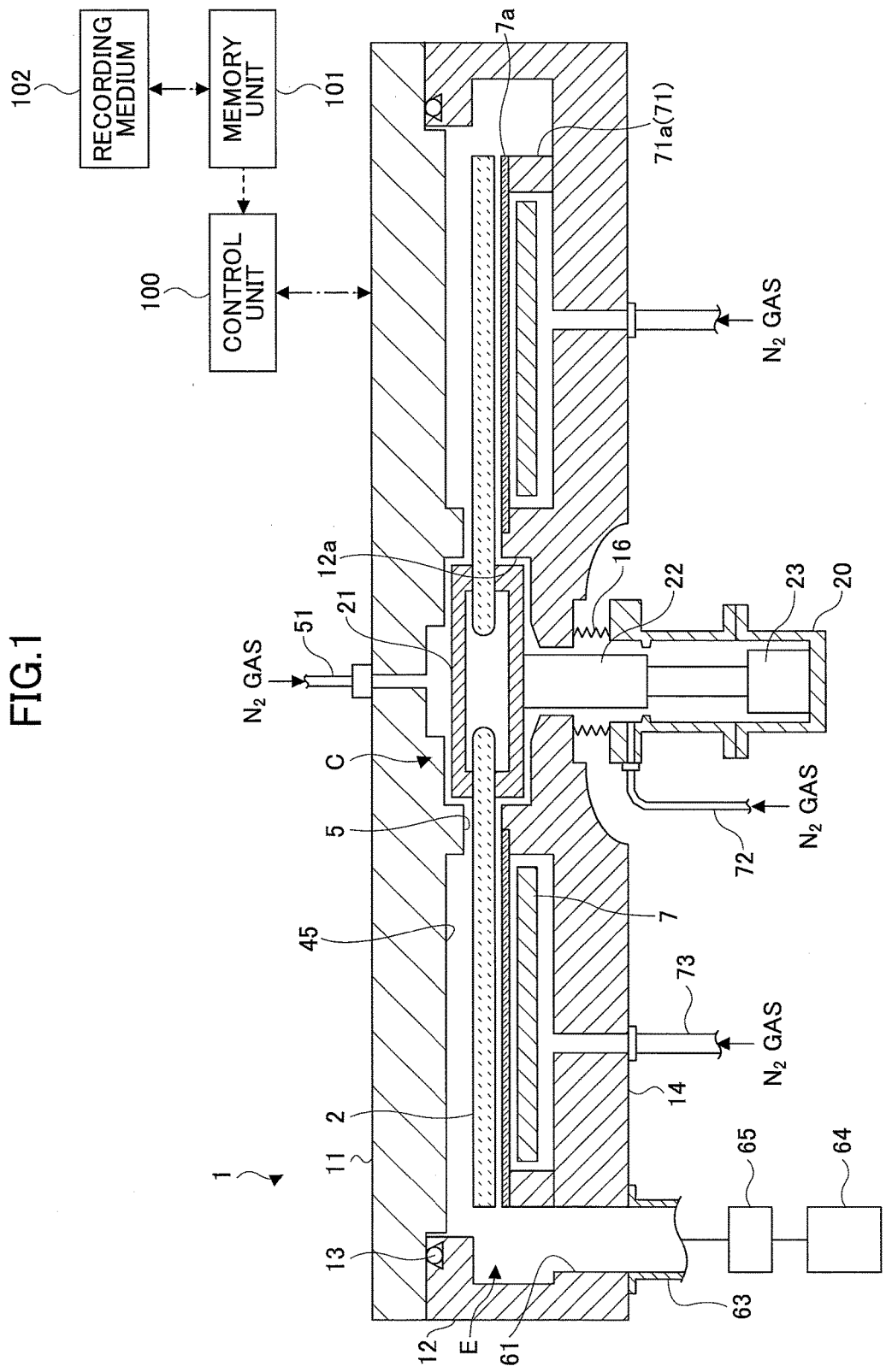
FIG. 1 is a schematic cross-sectional view of a film deposition apparatus of an embodiment.
Figure 2:
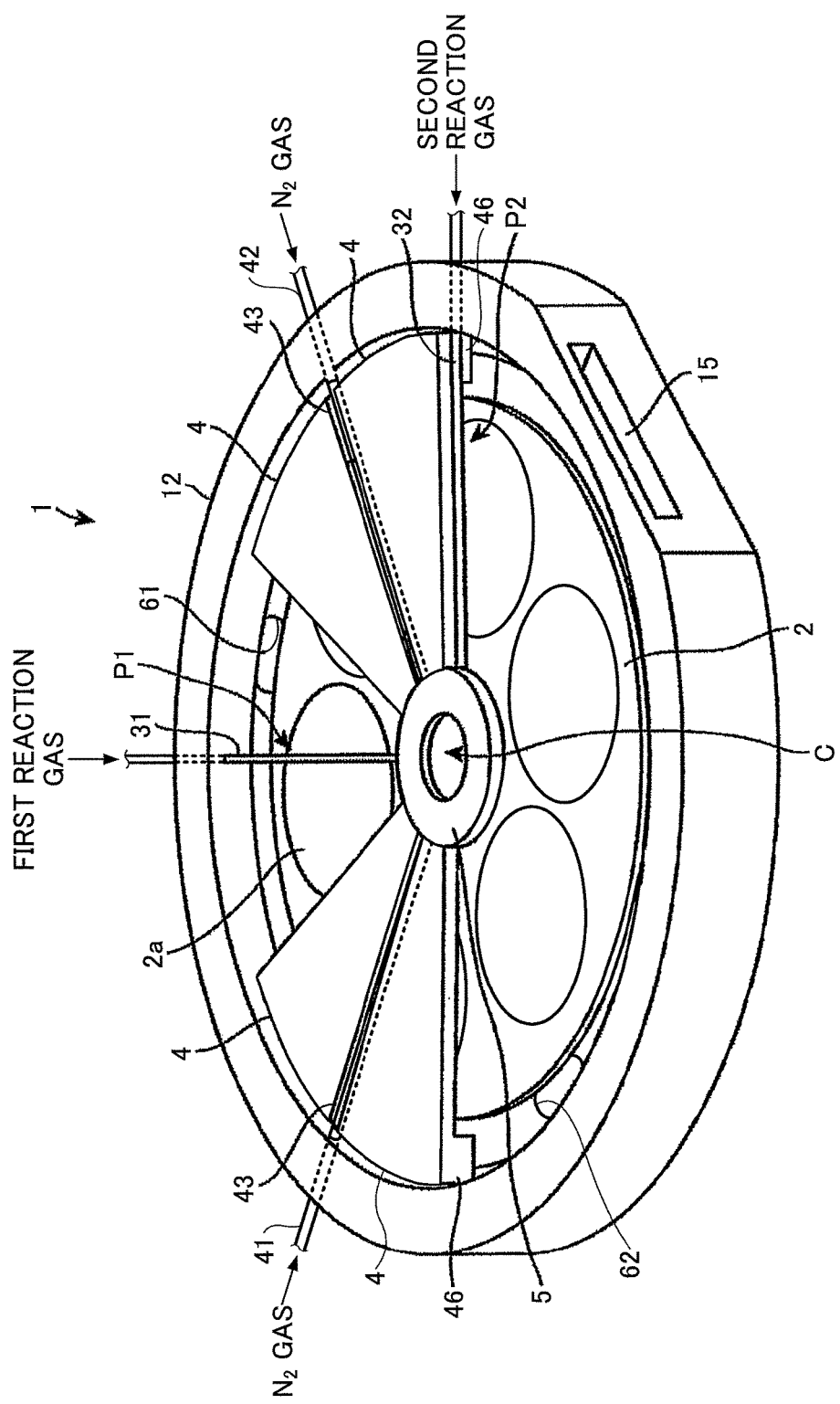
FIG. 2 is a schematic perspective view of the film deposition apparatus of the embodiment.
Figure 3:
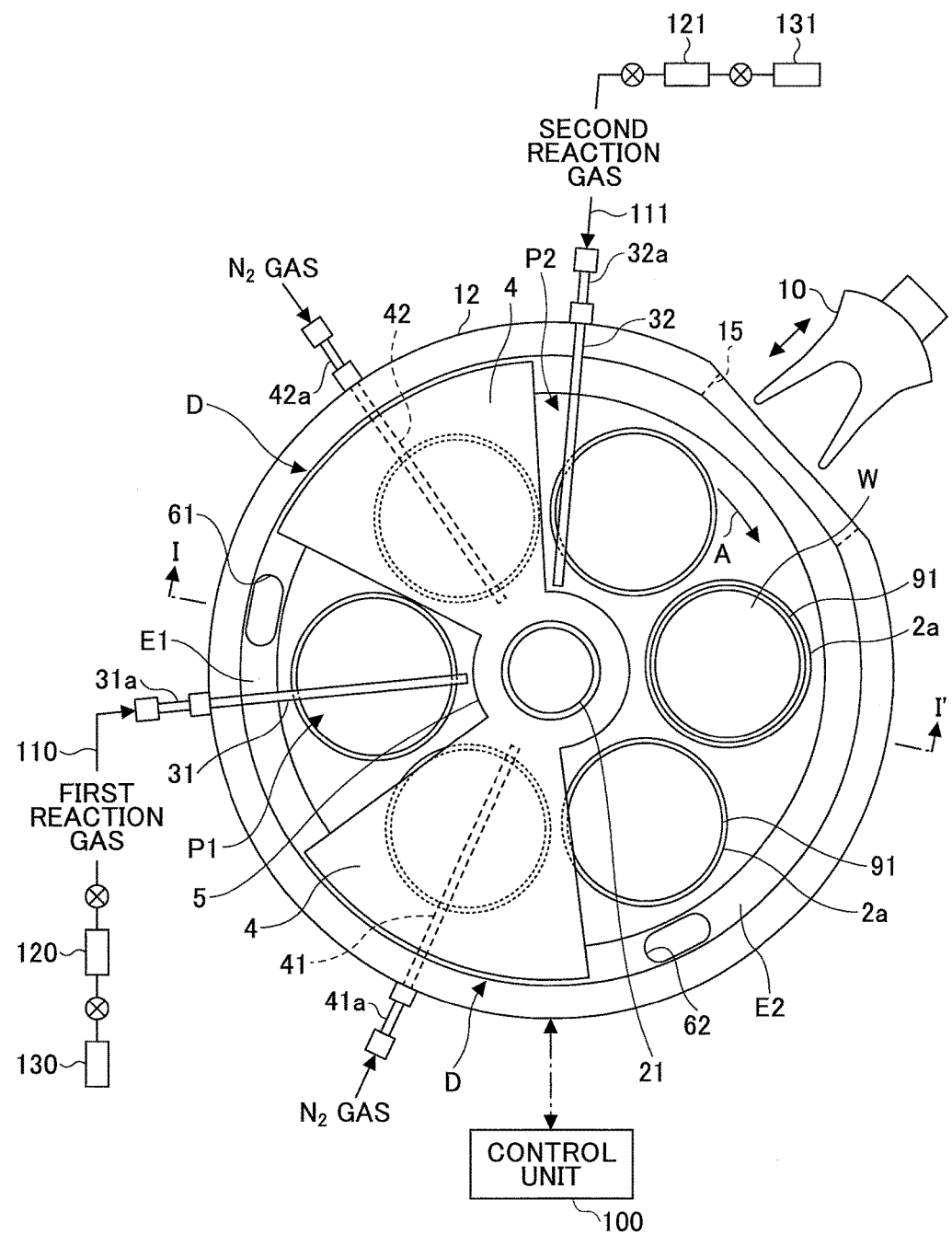
FIG. 3 is a schematic plan view of the film deposition apparatus of the embodiment.

Referring to FIGS. 1-5, the film deposition apparatus of the embodiment is described. FIG. 1 is a schematic cross-sectional view of a film deposition apparatus of the embodiment. FIG. 2 is a schematic perspective view of the film deposition apparatus of the embodiment. FIG. 3 is a schematic plan view of the film deposition apparatus of the embodiment. For convenience of explanation, a ceiling plate is omitted from illustration in FIGS. 2 and 3.

Referring to FIGS. 1 to 3, the film deposition apparatus of the embodiment includes a vacuum chamber 1 having a substantially circular shape in its plan view and a flattened shape in its side view, and a turntable 2 having its rotational center in the center of the vacuum chamber 1. The vacuum chamber 1 is a treatment chamber for depositing a film on the upper surface of a wafer which is accommodated inside the vacuum chamber 1. The vacuum chamber 1 includes a chamber body 12 having a bottomed cylindrical shape, and a ceiling plate 11, which is detachably provided onto the upper surface of the chamber body 12 through a sealing member 13 such as an O-ring to hermetically seal the chamber 1.

The turntable 2 is accommodated inside the vacuum chamber 1 so as to be revolvable. The turntable 2 is fixed by a core portion 21 formed in a cylindrical shape at the center portion of the turntable 2. This core unit 21 is fixed to the upper end of a revolving shaft 22 extending in the vertical direction. The revolving shaft 22 penetrates through a bottom portion 14 of the vacuum chamber 1. The lower end of the revolving shaft 22 is attached to a driving unit 23. The driving unit 23 includes a pressure air cylinder and a stepping motor to lift up and down the revolving shaft 22 and therefore lift up and down the turntable 2. The driving unit 23 causes the revolving shaft 22 to be rotated around a vertical axis to revolve the turntable 2. The revolving shaft 22 and the driving unit 23 are accommodated in a cylindrical case body 20 whose upper surface is opened. A flange portion provided on the upper surface of the case body 20 is hermetically attached to the lower surface of the bottom portion 14 of the vacuum chamber 1 to maintain a gastight state between the inner atmosphere and the outer atmosphere of the case body 20. When the turntable 2 lifts up and down, a bellows 16 contracts and expands in response to the lifting-up and the lifting-down of the turntable 2. Therefore, the gastight state between the inner atmosphere and the outer atmosphere of the case body 20 can be maintained. The bellows 16 and the driving unit 23 are an example on a drive mechanism.

Referring to FIGS. 2-3, multiple circular concave portions 2a (as much as six) are formed along the revolving direction (the peripheral direction) of the turntable 2. Referring to FIG. 3, the concave portion 2a is provided with a substrate supporting member 91 for mounting a semiconductor wafer (hereinafter, referred to as a "wafer W") which is a substrate. FIG. 3 illustrates a state where the wafer W is mounted only one substrate supporting member 91 for convenience. Detailed substrate supporting member 91 is described later.

Referring to FIGS. 2 and 3, a reaction gas nozzle 31, a reaction gas nozzles 31 and 32 and separation gas nozzles 41 and 42, which are made of, for example, quartz, are arranged above the turntable 2 while interposing gaps in the peripheral direction of the chamber 1 (the revolving direction along an arrow A in FIG. 3 of the turntable 2). In FIGS. 2 and 3, the separation gas nozzle 41, the reaction gas nozzle 31, the separation gas nozzle 42, and the reaction gas nozzle 32 are arranged in this order in the clockwise direction (the revolving direction of the turntable 2) from a transfer opening 15 described below. These nozzles 31, 32, 41, and 42 are attached to the chamber body 12 by fixing gas introducing ports 31a, 32a, 41a, and 42a (see FIG. 3), which are base portions of the nozzles 31, 32, 41, and 42, respectively, to the outer peripheral wall of the vacuum chamber 1 so as to horizontally extend along radii of the chamber body 12. Thus, these nozzles 31, 32, 41, and 42 are introduced inside the vacuum chamber 1 from the outer peripheral wall of the vacuum chamber 12.

Within the embodiment, as illustrated in FIG. 3, the reaction gas nozzle 31 is connected to a supplying source 130 of supplying the first reaction gas through a pipe 110, a flow rate controller 120, or the like. The reaction gas nozzle 32 is connected to a supplying source 131 of supplying the second reaction gas through a pipe 111, a flow rate controller 121, or the like. The separation gas nozzles 41 and 42 are connected to a supplying source (not illustrated) of a separation gas through a pipe, a flow rate control valve, or the like (not illustrated). The separation gas may be an inert gas such as a rare gas of helium (He), Argon (Ar) or the like or a nitrogen ($N_2$) gas. Within this embodiment, an example of using a $N_2$ gas is described.

Multiple gas ejection holes 35 opening toward the turntable 2 are arranged in the reaction gas nozzles 31 and 32 along the longitudinal directions of the reaction gas nozzles 31 and 32 at an interval of, for example, 10 mm. A lower area of the reaction gas nozzle 31 is a first process area P1 for causing the first reaction gas to adsorb onto the wafer W. A lower area of the reaction gas nozzle 32 is a second process area P2 for supplying a second reaction gas reacting with the first reaction gas adsorbing onto the wafer W to produce a molecular layer being a reaction product. The molecular layer being the reaction product forms a film to be deposited (formed).

The first reaction gas may be various gases. Ordinarily, a raw material gas being the raw material of the film to be formed is selected as the first reaction gas. For example, in a case where a silicon oxide film is formed, a silicon-containing gas such as bis(tertiary-butylaminosilane) (BT-BAS) gas is selected.

The second reaction gas may be various gases as long as the second reaction gas reacts with the first reaction gas to produce a reaction product. For example, in a case where a silicon oxide film is formed, an oxidation gas such as an ozone ($O_3$) gas is selected.

Referring to FIGS. 2 and 3, two convex portions 4 are provided inside the vacuum chamber 1. The convex portions 4 are attached to the lower surface of the ceiling plate 11 so as to protrude toward the turntable 2 so that the convex portions and the separation gas nozzles 41, 42 form the separating areas D. Each convex portion 4 has a substantially sector form in its plan view with its apex cut in a circular arc shape. Within this embodiment, an inner circular arc is connected to a protruding portion 5 (described later), and an outer circular arc is arranged along an inner peripheral surface of the chamber body 12 of the vacuum chamber 1.

Figure 4:
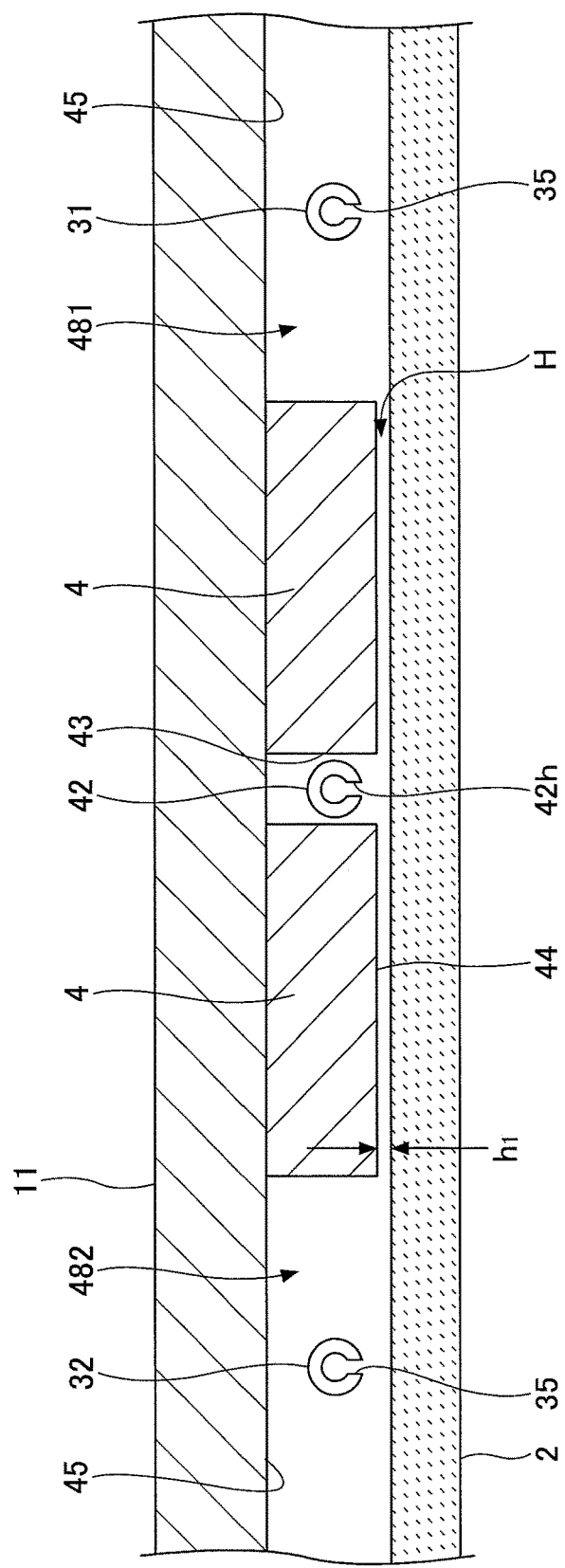
FIG. 4 is a schematic cross-sectional view of the film deposition apparatus of the embodiment taken along a concentric circle of a turntable.

FIG. 4 is a schematic cross-sectional view of the film deposition apparatus of the embodiment taken along a concentric circle of the turntable, and illustrates a cross-section of the vacuum chamber 1 along the concentric circle of the turntable from the reaction gas nozzle 31 to the reaction gas nozzle 32. Referring to FIG. 4, for the convenience of explanation, the substrate supporting member 91 and the wafer W are omitted from the illustration.

Referring to FIG. 4, a convex portion 4 is attached to the lower surface of the ceiling plate 11. Therefore, a flat and low ceiling surface 44 (a first ceiling surface) being the lower surface of the convex portion 4 and a high ceiling surface 45 (a second ceiling surface), which is positioned on both sides of the ceiling surface 44 and higher than the ceiling surface 44 exist inside the vacuum chamber 1. The low ceiling surface 44 is shaped like a sector having an outer edge cut so as to form like a circular arc in its plan view. Further, as illustrated in FIG. 4, a groove portion 43 is formed in a center of the convex portion 4 in its peripheral direction so as to extend in the radius direction. The separation gas nozzle 42 is accommodated inside the groove portion 43. Another groove portion 43 is similarly formed in another convex portion 4. The separation gas nozzle 41 is accommodated in the other groove portion 43. The reaction gas nozzles 31 and 32 are provided in spaces lower than the high ceiling surface 45. The reaction gas nozzles 31 and 32 are provided in the vicinity of the wafer W and apart from the high ceiling surface 45. Referring to FIG. 4, the reaction gas nozzle 31 is provided in a space 481 below the high ceiling surface 45 on the right side, and the reaction gas nozzle 32 is provided in a space 482 below the high ceiling surface 45 on the left side.

The multiple gas discharging holes 42h (see FIG. 4) opening toward the turntable 2 are provided in the separation gas nozzles 41 and 42, which are accommodated in the groove portions 43 of the convex portions 4. The gas injection holes 42h are arranged along the longitudinal directions of the separation gas nozzles 41 and 42 at an interval of, for example, 10 mm.

A separation space H, which is narrow, is formed between the ceiling surface 44 and the turntable 2. When the $N_2$ gas is supplied from the gas discharging holes 42h of the separation gas nozzle 42, the $N_2$ gas flows toward the spaces 481 and 482 through the separation space H. At this time, the volume of the separation space H is smaller than the volume of the spaces 481 and 482. Therefore, the pressure of the separation space H is relatively higher than the pressure in the spaces 481 and 482. Said differently, the separation space H having a high pressure is formed between the spaces 481 and 482. Further, the $N_2$ gas flowing into the spaces 481 and 482 from the separation space H functions as a counter flow against the first reaction gas in the first process area P1 and a counter flow against the second reaction gas in the second process area P2. Therefore, the first reaction gas from the first process area P1 and the second reaction gas from the second process area P2 are separated by the separation space H. Therefore, it is possible to prevent the first reaction gas and the second reaction gas from mixing inside the vacuum chamber 1 to cause a reaction.

It is preferable to set the height h1 of the ceiling surface 44 relative to the upper surface of the turntable 2 suitable for increasing the pressure in the separation space H higher than the pressure in the spaces 481 and 482 in consideration of the pressure inside the vacuum chamber 1 at the time of forming the film, the revolving speed of the turntable 2, the supply amount of the separation gas, or the like.

As illustrated in FIGS. 2 and 3, the protrusion portion 5 surrounding the outer periphery of the core portion 21, to which the turntable 2 is fixed, is provided under the lower surface of the ceiling plate 11. The protrusion portion 5 is continuously formed from the convex portions 4 at portions on a side of the revolving center of the convex portions 4. The lower surface of the protrusion portion 5 has substantially the same height as that of the ceiling surface 44.

Figure 5:
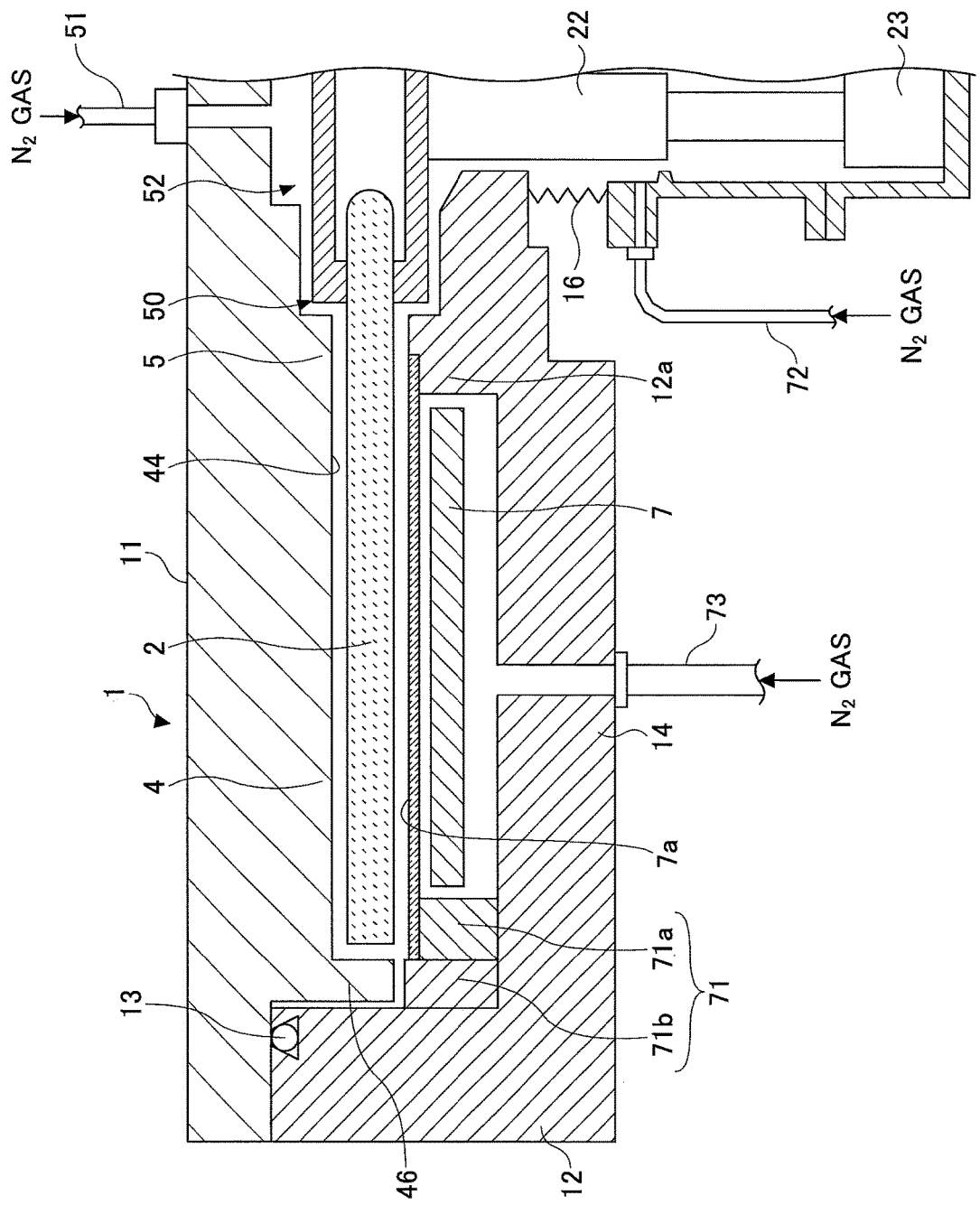
FIG. 5 is a schematic cross-sectional view of a separation area of the film deposition apparatus of the embodiment.

FIG. 1 is a cross-sectional view taken along a line I-I' of FIG. 3. FIG. 1 illustrates an area where the ceiling surface 45 is provided. FIG. 5 is a cross-sectional view of an area including the ceiling surface 44. As illustrated in FIG. 5, a peripheral edge portion (a portion of the vacuum chamber 1 on the outer edge side) of the convex portion 4 is in a sector-like shape has a bent portion 46 bent in a L-like shape so as to face the outer end surface of the turntable 2. The bent portion 46 prevents reaction gases from intruding from the both sides of the separating area D in a manner similar to the convex portion 4 to prevent the first reaction gas and the second reaction gas from mixing. The convex portion 4 in the substantially sector form is provided in the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

As illustrated in FIG. 5, the inner peripheral wall of the chamber body 12 has a vertical surface in the vicinity of the outer peripheral surface of the bent portion 46 in the separation areas D. However, as illustrated in FIG. 1, the inner peripheral wall of the chamber body 12 is recessed outward in a portion other than the separating areas D, for example, from a portion facing the outer edge surface of the turntable 2 toward the bottom portion 14. Hereinafter, for convenience of explanation, this recessed portion having a substantially rectangular shape in its cross-sectional view is referred to as an evacuation area E. Specifically, as illustrated in FIG. 3, the evacuation area communicating with the first process area P1 is referred to as a first evacuation area E1 and the evacuation area communicating with the second process area P2 is referred to as a second evacuation area E2. A first evacuation port 61 and a second evacuation port 62 are respectively formed in the bottom portions of the first and second evacuation areas E1 and E2, as illustrated in FIGS. 1 to 3. The first and second evacuation ports 61 and 62 may be connected to a vacuum pump 64 being an evacuating means through an evacuation pipe 63. Further, a pressure controller 65 is provided between the vacuum pump 64 and the evacuation pipe 63.

As illustrated in FIGS. 1 and 5, a heater unit 7 being a heating means is provided in a space between the turntable 2 and the bottom portion 14 of the vacuum chamber 1. The wafer W on the turntable is heated through the turntable 2 to have a temperature determined in a process recipe (for example, 200° C.). Referring to FIG. 5, on the lower side of the turntable 2, a cover member 71 shaped like a ring is provided to prevent the gas from intruding into a lower area lower than the turntable 2 by separating an atmosphere between an upper space upper than the turntable 2 and the first and second evacuation areas E1 and E2 from an atmosphere where the heater unit 7 is installed. The cover member 71 includes an inner member 71a provided in a position vertically corresponding to the outer edge portion of the turntable 2 and to an outer peripheral side outer than the outer edge portion of the turntable 2, and an outer member 71b provided between the inner member 71a and the inner wall surface of the chamber 1. The outer member 71b is provided in the separation area D so as to be in the vicinity of the bent portion 46 below the bent portion 46 formed at the outer edge portion of the convex portion 4. The inner member 71a surrounds the heater unit 7 through the periphery of the heater unit 7 at the position lower than the outer edge portion of the turntable 2 (and at the position lower than a part slightly outer than the outer edge portion.

A part of the bottom portion 14 closer to the revolving center than the space where the heater unit 7 is arranged has the protrusion portion 12a protruding upward toward the lower surface of the core portion 21 provided on the lower surface of the turntable 2 and in the vicinity of the center portion of the turntable 2. A narrow space is provided between the protrusion portion 12a and the core portion 21. A gap between the inner peripheral surface of a through hole for the revolving shaft 22 penetrating through the bottom portion 14 and the rotational shaft 22 is small. The narrow space and the small gap communicate with the inside of the casing 20. A purge gas supplying pipe 72 is provided in the case body 20 so that the $N_2$ gas being a purge gas is supplied into the narrow space to purge the narrow space. In the bottom portion 14 of the vacuum chamber 1, multiple purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a restricts the gas from intruding into an area where the heater unit 7 is installed to bridge the inner peripheral surface of the outer member 71b (the upper surface of the inner member 71a) and the upper end portion of the protrusion portion 12a along the peripheral direction so as to cover the heater unit 7 and so on. The lid member 7a is made of, for example, quartz. The lid member 7a is described in detail later.

A separation gas supplying pipe 51 is connected to a center portion of the ceiling plate 11 of the vacuum chamber 1. The separation gas of the $N_2$ gas is supplied to a space 52 between the ceiling plate 11 and the core portion 21. The separation gas supplied to the space 52 is discharged toward the periphery of the turntable 2 along the surface on the side of a wafer mounting area of the turntable 2 through a narrow space 50 between the protrusion portion 5 and the turntable 2. The space 50 is maintained to have a pressure higher than those of the spaces 481 and 482 by the separation gas. Therefore, it is possible to prevent a BTBAS gas supplied to the first process area P1 and an $O_3$ gas supplied to the second process area P2 from mixing after passing through the center area C. Said differently, the space 50 (or the center area C) functions in a manner similar to the separation space H (or the separating area D).

As illustrated in FIGS. 2 and 3, a transfer opening 15 is formed in the side wall of the chamber 1 for serving and receiving the wafer W being the substrate between a transfer arm 10 provided outside and the turntable 2. The transfer opening 15 is opened and closed by a gate valve (not illustrated). At the position facing the transfer opening 15, the wafer W is served and received between the transfer arm 10 and the substrate supporting member 91 which is the wafer mounting area on the turntable 2. Further, a lift pin (not illustrated) for lifting the wafer W from the back surface side to serve and receive the wafer W and a lifting mechanism (not illustrated) for lifting the lift pin are provided at a portion of the turntable 2 corresponding to the position where the wafer W is served and received on the lower side of the turntable 2. Therefore, the lift pin penetrates through the substrate supporting member 91 of the turntable 2.

Further, as illustrated in FIG. 1, a control unit 100 includes a computer for controlling operations of the film deposition apparatus of the embodiment in its entirety. A program to be executed by the film deposition apparatus under control of the control unit 100 is stored in a memory of the control unit 100. This program includes groups of steps for performing the method of depositing the film as described below and is stored in a recording medium 102 such as a hard disk, a compact disk, a magnet-optical disk, a memory card, a flexible disk, or the like. The program is read in a memory unit 101 by a predetermined reading device and is installed inside the control unit 100.

[Rotary Mechanism]

Figure 6:
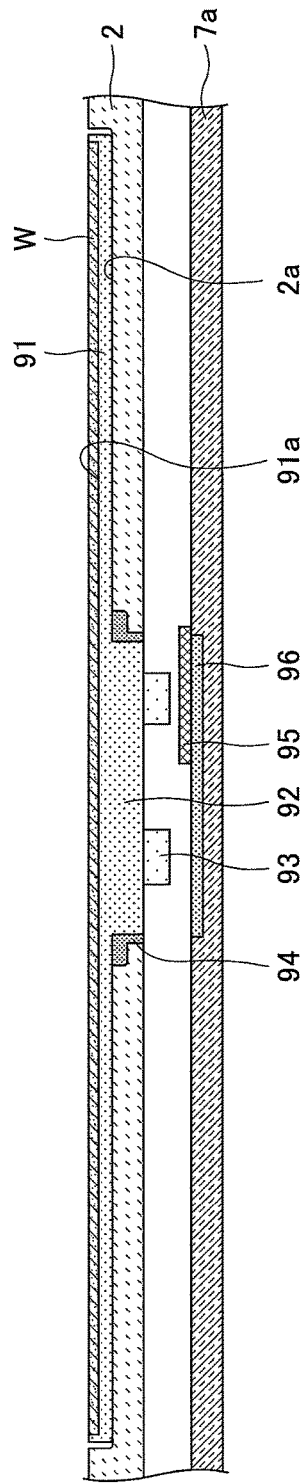
FIG. 6 is a schematic cross-sectional view of a rotary mechanism of the film deposition apparatus of the embodiment.
Figure 7:
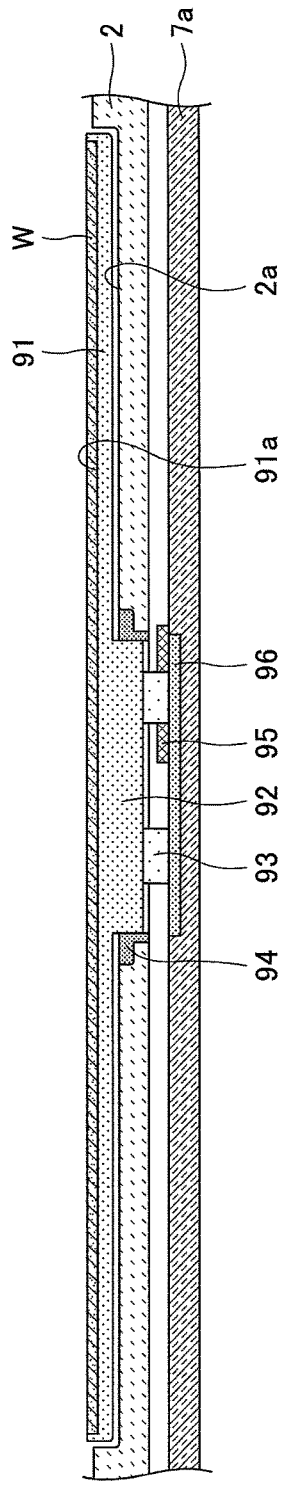
FIG. 7 is a schematic cross-sectional view of the rotary mechanism of the film deposition apparatus of the embodiment.

Referring to FIGS. 6 to 10B, the rotary mechanism of the wafer W in the film deposition apparatus of the embodiment is described. FIGS. 6 and 7 are schematic cross-sectional view illustrating a rotary mechanism of a wafer in the film deposition apparatus of the embodiment. FIGS. 6 and 7 are enlarged views of a part, in which a single concave portion 2a from among six concave portions 2a in FIGS. 2 and 3 is formed. FIG. 6 illustrates a positional relationship between the turntable 2 and the lid member 7a when the turntable 2 lifts up and the film is deposited on the wafer W. FIG. 7 illustrates the positional relationship between the turntable 2 and the lid member 7a when the turntable 2 lifts down and the wafer W is rotated (spun).

The turntable 2 is shaped like a disk made from a quartz plate having a thickness of about 10 mm. On the upper surface of the turntable 2, the concave portions 2a in a circular shape are formed. The substrate supporting member 91 can be attachably and detachably mounted on the upper surface of the turntable 2. A through hole in a circular shape is formed at the central part pf the concave portion 2a. On the bottom surface of each concave portion 2a of the turntable, multiple through holes (not illustrated) through which a lift pin penetrates. The lift pin supports the lower surface of the wafer W and causes the wafer W up and down.

The concave portion 2a has the inner diameter slightly greater (by, for example, 1 mm) than the outer diameter of the substrate supporting member 91 and the depth substantially equal to the thickness of the substrate supporting member 91. With this, the upper surface of the substrate supporting member 91 mounted on the concave portion 2a has the height substantially the same as the height of the upper surface of the turntable (at the area where the substrate supporting member 9l is not installed). If a step is formed between the upper surface of the turntable and the upper surface of the substrate supporting member 91, a gas flow may be disturbed above the turntable 2 and the substrate supporting member 91. Therefore, there is a case where film thickness evenness of the film depositing on the wafer W may be affected. In order to reduce the influence, the height of the upper surface of the turntable is made substantially the same as the height of the upper surface of the substrate supporting member 91 to prevent the gas flow from being disturbed.

Figure 8A:
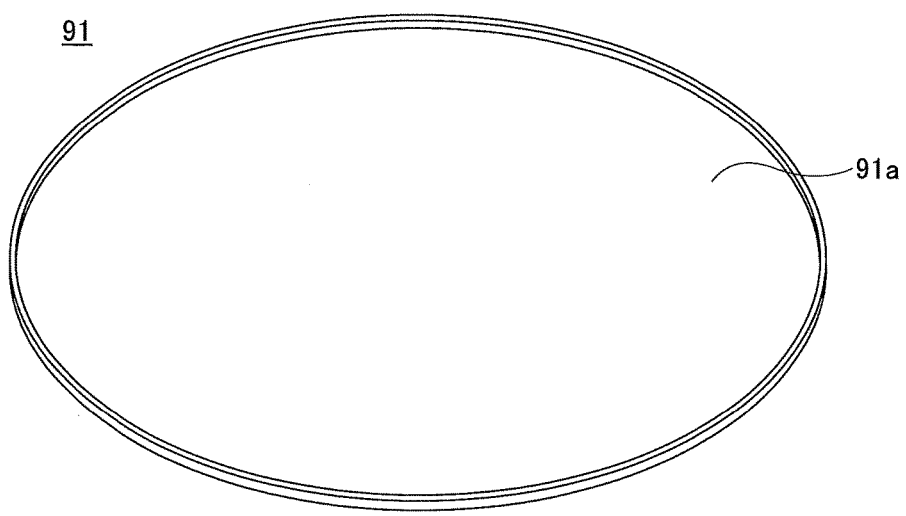
FIG. 8A illustrates an exemplary substrate supporting member in the film deposition apparatus of the embodiment.
Figure 8B:
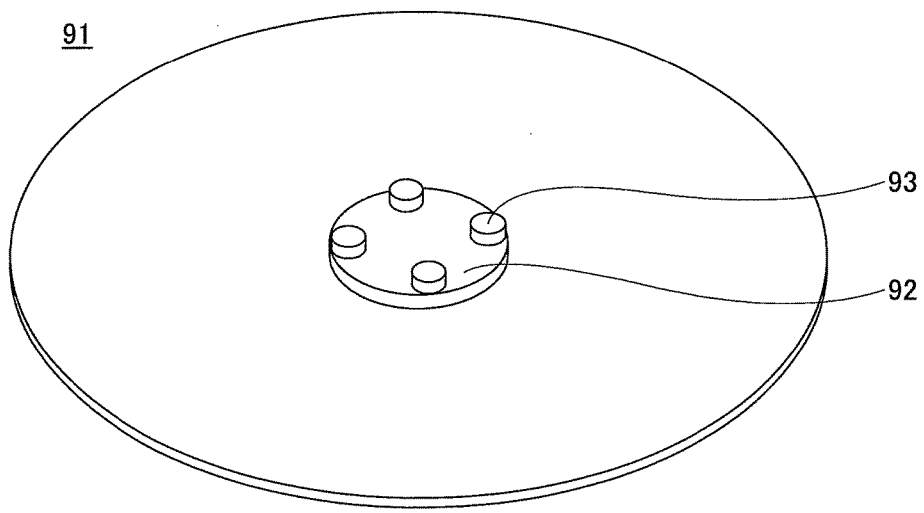
FIG. 8B illustrates another exemplary substrate supporting member in the film deposition apparatus of the embodiment.
Figure 8C:
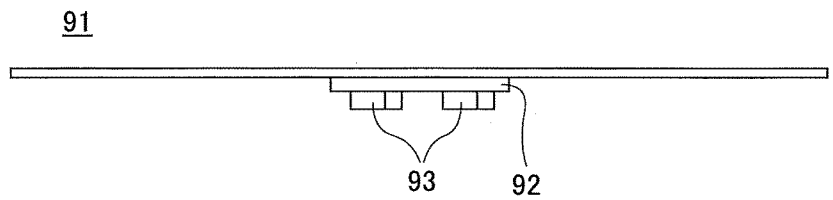
FIG. 8C illustrates another exemplary substrate supporting member in the film deposition apparatus of the embodiment.

FIGS. 8A-8C illustrate an exemplary substrate supporting member in the film deposition apparatus of the embodiment. FIG. 8A is a perspective view of the substrate supporting member viewed from the upper surface side of the substrate supporting member. FIG. 8B is a perspective view of the substrate supporting member viewed from the lower surface side of the substrate supporting member. FIG. 8C is a side view of the substrate supporting member.

As illustrated in FIGS. 8A-8C, the substrate supporting member 91 is formed like a disk made of a quartz having a thickness of about, for example, 4 mm, A mounting portion 91a is formed on the upper surface of the substrate supporting member 91 and shaped in a circular recessed shape to mount the wafer W thereon. On the bottom surface of each mounting portion 91a of the turntable, multiple through holes (not illustrated) through which lift pins penetrate. The inner diameter of the mounting portion 91a is slightly greater than the diameter of the wafer W (by, for example, 2 mm). The depth of the mounting portion 91a is substantially equal to the thickness of the wafer W. With this, when the wafer W is mounted on the mounting portion 91a, the height of the upper surface of the substrate supporting member 91 (at the area where the wafer W is not installed) is substantially the same as the height of the upper surface of the wafer W. If a step is formed between the upper surface of the substrate supporting member 91 and the upper surface of the wafer W, a gas flow may be disturbed above the substrate supporting member 91 and the wafer W. Therefore, there is a case where film thickness evenness of the film depositing on the wafer W may be affected. In order to reduce the influence, the height of the upper surface of the substrate supporting member 91 is made substantially the same as the height of the upper surface of the wafer W to prevent the gas flow from being disturbed.

A flange portion 92 is shaped like a protrusion and provided at a center portion on (below) the lower surface of the substrate supporting member 91. The flange portion 92 is made of, for example, quartz. Multiple first protruding portions 93 (as many as 4 in FIGS. 8A-8B) protrude from the flange portion 92 onto the side of the lid member 7a and are arranged at an even interval along the peripheral direction of the flange portion 92. Each first protruding portion 93 is shaped like a column and made of quartz. A bearing 94 is provided between the outer peripheral surface of the flange portion 92 and the inner peripheral surface of the through hole of the turntable 2 (see FIGS. 6-7).

Figure 9A:
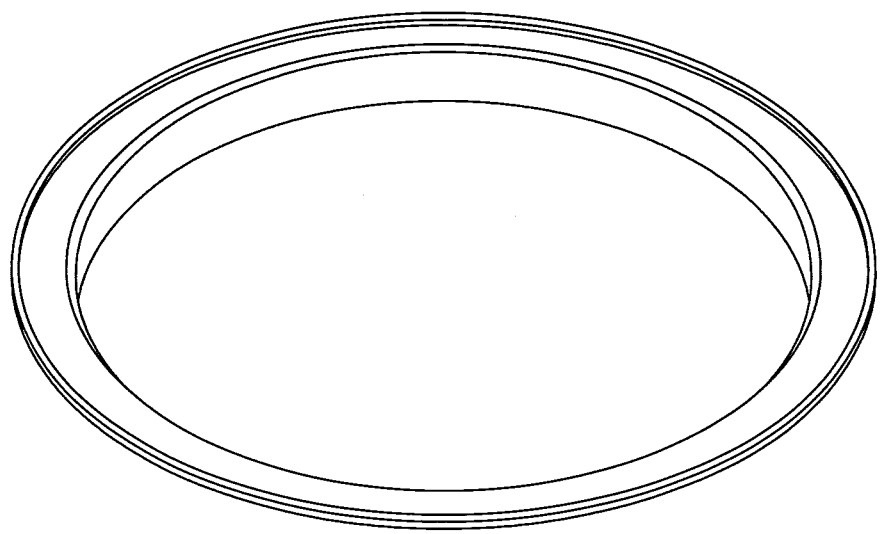
FIG. 9A illustrates an exemplary bearing in the film deposition apparatus of the embodiment.
Figure 9B:
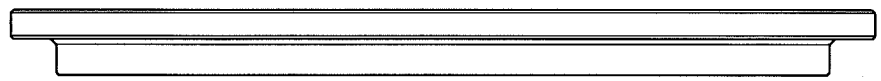
FIG. 9B illustrates another exemplary bearing in the film deposition apparatus of the embodiment.

FIGS. 9A and 9B illustrate an exemplary bearing in the film deposition apparatus of the embodiment. FIG. 9A is a perspective view of the bearing viewed from the upper surface side. FIG. 9B is a side view of the bearing.

Referring to FIGS. 9A and 9B, the bearing 94 includes a form similar to a flange, in which a portion of a circular ring is coupled to a cylindrical portion. The bearing 94 is a member of supporting the flange portion 92 of the substrate supporting member 91 so that the flange portion 92 is freely rotatable around the revolving shaft of the substrate supporting member 91. By providing the bearing 94, the substrate supporting member 91 is accurately and smoothly rotatable relative to the turntable 2. The material of the bearing 94 preferably has a friction coefficient between the bearing 94 and the flange portion 92. For example, in a case where the flange portion 92 is made of quartz, the material of the bearing 94 is preferably made of sapphire or ruby. With this, a smooth operation is realized in an unlubricated state.

Titanium carbide coats at least one of the sliding surfaces between the bearing 94 and the flange portion 92, namely at least one of the sliding surface of the bearing 94 relative to the flange portion 92 and the sliding surface of the flange portion 92 relative to the bearing 94. In a case where titanium carbide coats the sliding surface, a stable low friction coefficient is obtainable under a high temperature (300° C. or greater) by self-lubricating property of titanium carbide. As a result, not only under a low temperature (e.g., less than 300° C.) but also under a high temperature (300° C. or greater), the sliding resistance between the bearing 94 and the flange portion 92 is reduced to realize a smooth operation. The film thickness of the coating of titanium carbide is not specifically limited. The film thickness is preferably 1 μm or greater from the viewpoint of durability and 10 μm or smaller from the viewpoint of contact.

Figure 10A:
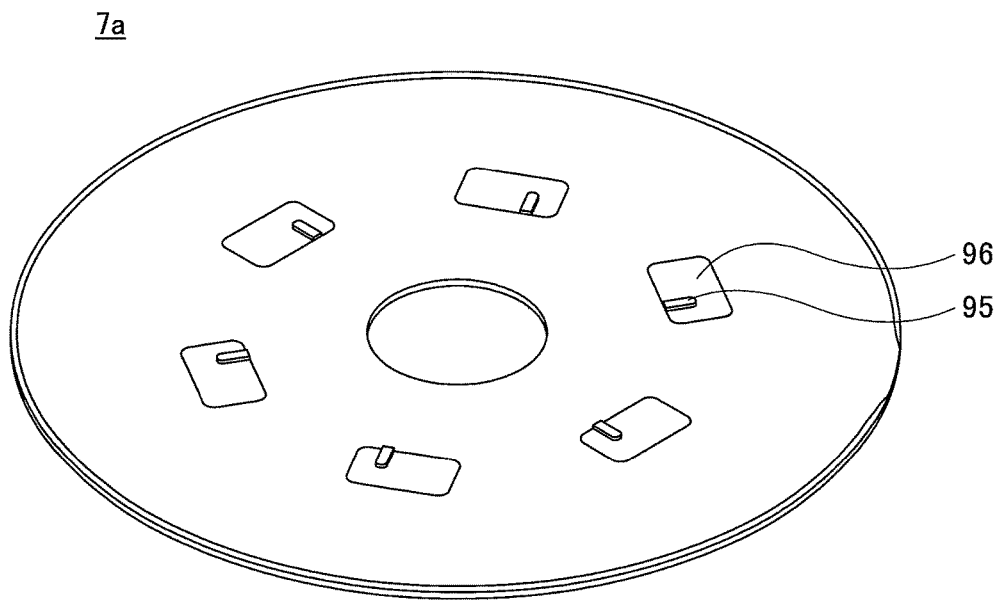
FIG. 10A illustrates an exemplary lid member in the film deposition apparatus of the embodiment.
Figure 10B:
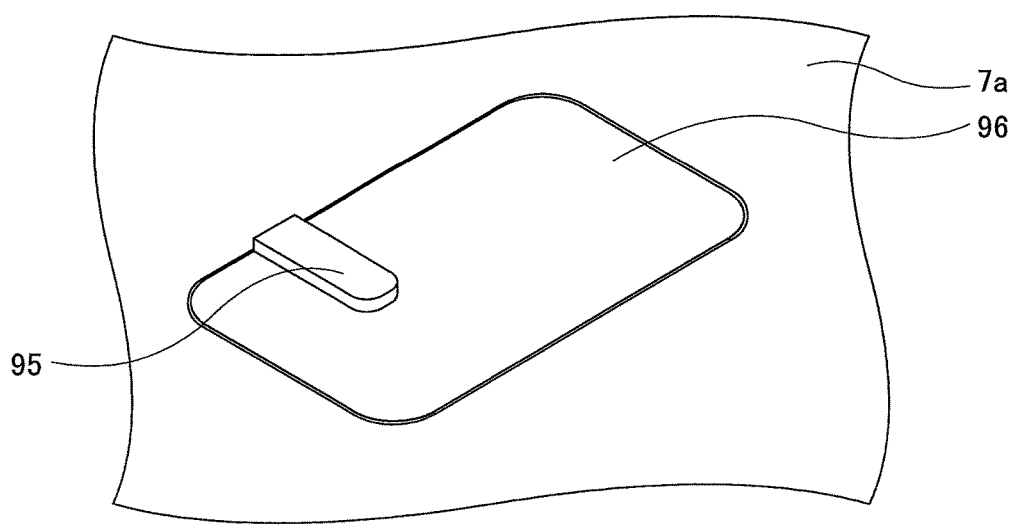
FIG. 10B illustrates another exemplary lid member in the film deposition apparatus of the embodiment.

FIGS. 10A and 10B illustrate an exemplary lid member in the film deposition apparatus of the embodiment. FIG. 10A is a perspective view of the lid member viewed from the upper surface side. FIG. 10B is an enlarged view of a part of FIG. 10A.

As illustrated in FIG. 10A, the lid member is shaped like a disc. A through hole in a circular shape is formed at the central part of the lid member 7a. ON the upper surface of the lid member 91, a slip seat 96 is provided at a position corresponding to the flange portion 92 of the substrate supporting member 91. Said differently, multiple slip seats 96 (six slip seats 96 in FIG. 10A) are disposed on the upper surface of the lid member 7a along the peripheral direction of the lid member 7a on the upper surface of the lid member 7a. Referring to FIGS. 6 and 7, the slip seats are provided on corresponding concave portion so that the height of the upper surfaces of the slip seats 96 is the same as the height of the upper surface of the lid member 7a. The material of the slip seats 96 preferably has the friction coefficient relative to the first protruding portion 93 smaller than the friction coefficient relative to the lid member 7a. For example, in a case where the first protruding portion 93 is made of quartz, the slip seats 96 are preferably made of sapphire or ruby. With this, the smooth operation can be realized in the unlubricated state.

Further, titanium carbide preferably coats at least one of the sliding surfaces between the slip seat 96 and the first protruding portion 93, namely at least one of the sliding surface of the slip seat 96 relative to the first protruding portion 93 and the sliding surface of the first protruding portion 93 relative to the slip seat 96. In a case where titanium carbide coats the sliding surface, a stable low friction coefficient is obtainable under a high temperature (for example, 300° C. or greater) by self-lubricating property of titanium carbide. As a result, not only under the low temperature (e.g., less than 300° C.) but also under the high temperature (300° C. or greater), the sliding resistance between the slip seat 96 and the first protruding portion 93 is reduced to realize a smooth operation. The film thickness of the coating of titanium carbide is not specifically limited. The film thickness is preferably 1 μm or greater from the viewpoint of durability and 10 μm or smaller from the viewpoint of contact.

As illustrated in FIG. 10B, each second protruding portion 95 is disposed on the corresponding upper surface of the slip seat 96 and protrudes on the side of the turntable 2. Two second protruding portions 95 may be provided at a position corresponding to each first protruding portion 93. The second protruding portions 95 are shaped like a protrusion and extend in the radial direction of the lid member 7a. The material of the second protruding portions 95 preferably has a small friction coefficient relative to the first protruding portion 93. For example, in a case where the first protruding portion 93 is made of quartz, the second protruding portions 95 are preferably made of sapphire or ruby. With this, the smooth operation can be realized in the unlubricated state.

Further, titanium carbide preferably coats at least one of the sliding surfaces between the second protruding portion 95 and the first protruding portion 93, namely at least one of the sliding surface of the second protruding portion relative to the first protruding portion 93 and the sliding surface of the first protruding portion 93 relative to the second protruding portion. In a case where titanium carbide coats the sliding surface, a stable low friction coefficient is obtainable under a high temperature (for example, 300° C. or greater) by self-lubricating property of titanium carbide. As a result, not only under the low temperature (e.g., less than 300° C.) but also under the high temperature (300° C. or greater), the sliding resistance between the second protruding portion 95 and the first protruding portion 93 is reduced to realize a smooth operation. The film thickness of the coating of titanium carbide is not specifically limited. The film thickness is preferably 1 µm or greater from the viewpoint of durability and 10 µm or smaller from the viewpoint of contact.

[Method of Depositing a Film]

Described next is an operation (a method of depositing a film) of the film deposition apparatus of this embodiment. The method of depositing the film is to deposit a film having a predetermined film thickness onto a wafer W by performing a carry-in process, a film deposition process, a spin process, and a carry-out process and alternately repeating the film deposition process and the spin process several times. Described below is a method of forming a silicon oxide film using a bis(tertiary-butylaminosilane) gas (BTBAS gas) and O₃ gas.

(Carry-in Process)

At first, a gate valve (not illustrated) is opened. Referring to FIG. 3, the wafer W is served and received by the mounting portion 91a of the substrate supporting member 91 through the transfer opening 15 by s transfer arm 10 from the outside of the vacuum chamber 1. When the mounting portion 91a is stopped at a position facing the transfer opening 15, the lift pin (not illustrated) lifts up or down from the bottom portion side of the vacuum chamber 1 through the through hole in the bottom surface of the mounting portion 91a to serve or receive the wafer W. The wafer W is served and received while the turntable 2 is intermittently revolved so as to mount the wafers W inside the mounting portions 91a equal to 6.

(Film Deposition Process)

After the wafer W is carried into the vacuum chamber 1, the gate valve is closed and the inside of the vacuum chamber 1 is evacuated to be a predetermined set pressure by the vacuum pump 64. Next, the turntable 2 is clockwise revolved (an orbital motion). The turntable 2 and the substrate supporting member 91 is previously heated to be a predetermined temperature. The wafer W is heated after the wafer W is mounted on the mounting portion 91a. After the wafer W is heated to be the predetermined temperature, a first reaction gas (the BTBAS gas) is supplied from the reaction gas nozzle 31 into the first process area P1 and a second reaction gas (the O₃ gas) is supplied from the reaction gas nozzle 32 to the second process area P2.

Further, a separation gas (a N₂ gas) is supplied from separation gas nozzles 41 and 42.

When the wafer W passes through the first process area P1, which is positioned below the reaction gas nozzle 31, BTBAS molecules adsorb onto the upper surface of the wafer W. When the wafer W passes through the second process area P2, which is positioned below the reaction gas nozzle 32, O₃ molecules adsorb onto the upper surface of the wafer W and the adsorbed O₃ molecules cause the BTBAS molecules to be oxidized. Said differently, after the wafer W passes once through the first process area P1 and the second process area P2 on the revolving turntable 2, one molecular layer of silicon oxide is formed on the upper surface of the wafer W.

(Spin Process)

After the wafer W alternately passes through the first process area P1 and the second process area P2 predetermined number of times on the revolving turntable 2, a rotary process (the spin process) of the wafer W is performed.

Figure 11:
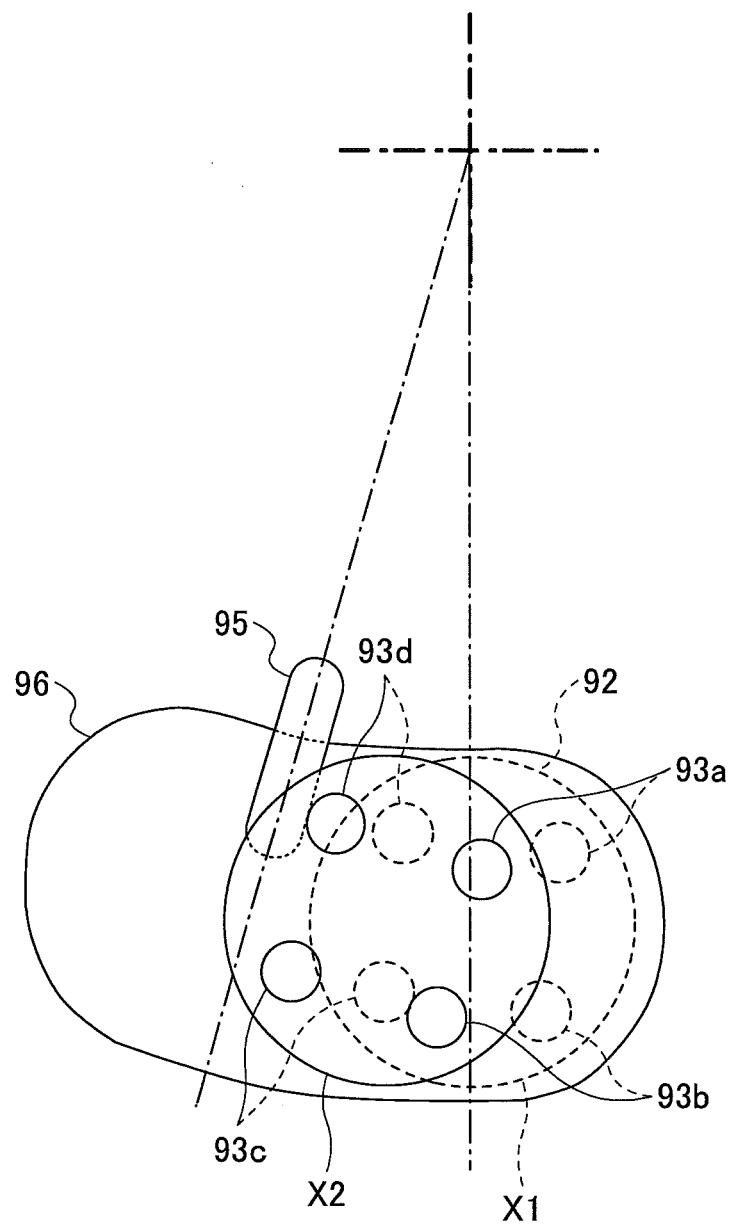
FIG. 11 illustrates an operation of rotating (spinning) the wafer in the film deposition apparatus of the embodiment.
Figure 12:
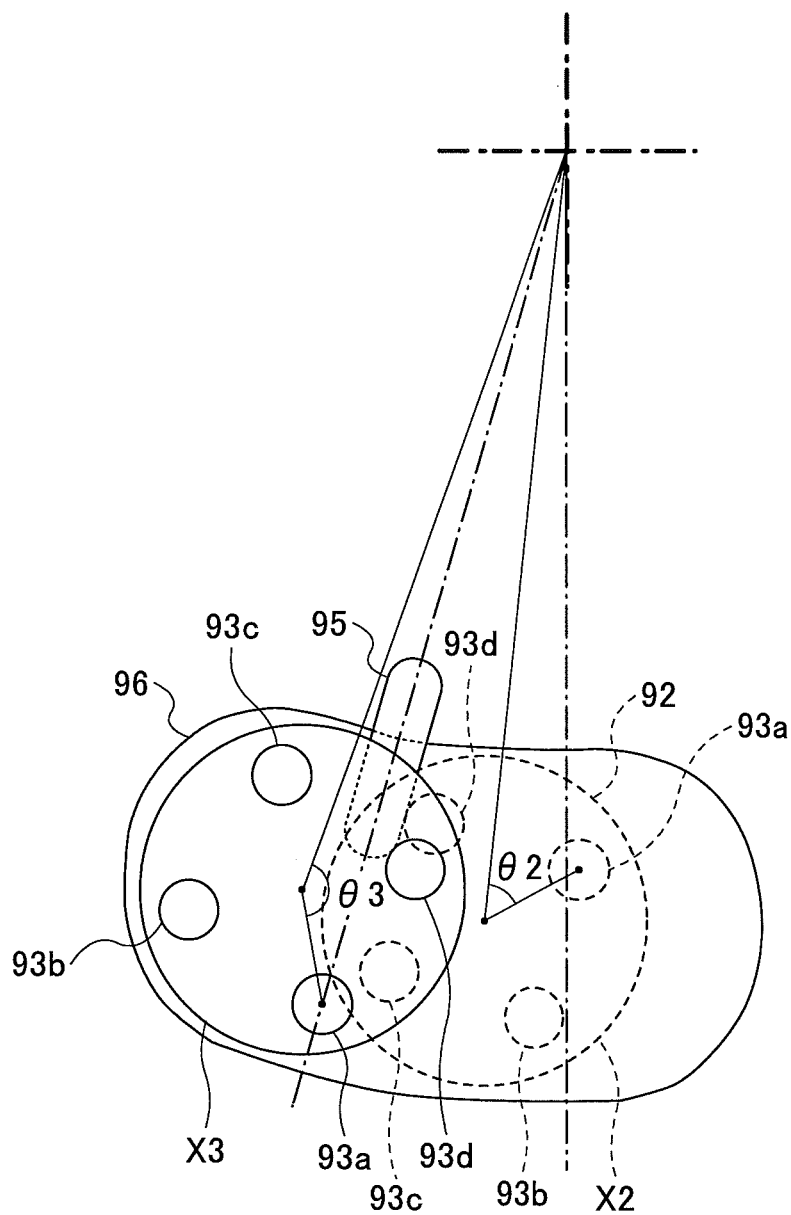
FIG. 12 illustrates another operation of rotating (spinning) the wafer in the film deposition apparatus of the embodiment.

FIGS. 11 and 12 illustrate an operation of spinning the wafer in the film deposition apparatus of this embodiment. FIG. 11 illustrates a positional relationship among the flange portion 92, the first protruding portion 93, and the second protruding portion 93 until the first protruding portion 93 contacts the second protruding portion 95. FIG. 12 illustrates the positional relationship among the flange portion 92, the first protruding portion 93, and the second protruding portion 93 after the first protruding portion 93 contacts the second protruding portion 95. The position X1 indicated by the broken line in FIG. 11 represents a state of starting the spin process. The position X2 indicated by the solid line in FIG. 11 and the broken line in FIG. 12 represents a state during the spin process. The position X3 indicated by the solid line in FIG. 12 represents a state after the spin process is completed.

The supply of the BTBAS gas and the supply of the O₃ gas are stopped. Then, the revolving of the revolving shaft 22 is stopped to cause the revolving of the turntable to be stopped. At this time, the revolving of the turntable 2 is stopped so that the first protruding portion 93 provided in the substrate supporting member 91 is positioned slightly on the upstream side (X1 illustrated in FIG. 11) relative to the second protruding portion 95, which is provided in the slip seat 96, in the revolving direction of the turntable 2.

Subsequently, the turntable 2 is moved down so that the first protruding portion 93 contacts the upper surface of the slip seat 96 and is mounted on the slip seat 96. After the first protruding portion is mounted on the slip seat 96 and then the turntable 2 is moved down, as illustrated in FIG. 7, the substrate supporting member 91 mounted on the concave portion 2a of the turntable 2 is slightly separated from the concave portion 2a. The height of the separated substrate supporting member 91 from the concave portion 2a preferably corresponds to a position where the lower surface of the flange portion 92 of the substrate supporting member 91 does not move over the upper surface of the bearing 94. For example, the height may be about 1 mm to 5 mm. With this, the flange portion 92 is continuously supported by the bearing 94 so as to be freely rotatable. Therefore, the horizontal position of the substrate supporting member 91 relative to the turntable 2 does not deviate.

Next, the revolving shaft 22 is clockwise revolved to revolve the turntable 2 until the first protruding portion 93d is moved to a position (X2 illustrated in FIG. 11) where the first protruding portion 93d contacts the second protruding portion 95 provided in the slip seat 96. Because the first protruding portions 93a, 93b, 93c, and 93d move so as to slip on the upper surface of the slip seat 96 at this time, the substrate supporting member 91 does not rotate relative to the turntable 2.

After the first protruding portion 93*d* contacts the second protruding portion 95, the revolving shaft 22 is further clockwise revolved to revolve the turntable 2. Then, the first protruding portion 93*d* contacting the second protruding portion 95 is prevented from moving in the revolving direction of the turntable 2 by the second protruding portion 95 provided in the slip seat 96. Therefore, the flange portion 92 moves in the radius direction of the turntable 2 while the first protruding portion 93*d* is contacting the side surface of the second protruding portion 95. Therefore, the flange portion 92 rotate clockwise and simultaneously moves on the upper surface of the slip seat 96 relative to the turntable 2. Said differently, the substrate supporting member 91 clockwise revolve relative to the turntable 2. After the substrate supporting member 91 is rotated by a predetermined angle θ (not illustrated) relative to the turntable 2, the revolving of the revolving shaft id stopped to stop the revolving of the turntable 2 (X3 illustrated in FIG. 12). As illustrated in FIG. 12, the predetermined angle θ is an angle of (θ3-θ2) subtracting an angle θ2 from an angle θ3, where the angle θ3 is formed between the first protruding portion 93*a* at the position X3 and the radius direction of the turntable 2, and the angle θ2 is formed between the first protruding portion 93*a* at the position X2 and the radius direction of the turntable 2. Said different, the angle θ3 is formed between a straight line connecting the center of the flange portion 92 at the position X3 to the center of the turntable 2 and a straight line connecting the center of the flange portion 92 to the center of the first protruding portion 93*a*. Said different, the angle θ2 is formed between a straight line connecting the center of the flange portion 92 at the position X2 to the center of the turntable 2 and a straight line connecting the center of the flange portion 92 to the center of the first protruding portion 93*a*. A preferred range of the predetermined angle θ is described later.

Next, as illustrated in FIG. 6, the revolving shaft 22 is moved up to move up the turntable 2 so that the position of the lower surface of the first protruding portion 93 is positioned above the position of the upper surface of the second protruding portion 95. With this, even if the turntable 2 is revolved the first protruding portion 93 cannot contact the second protruding portion 95. Therefore, the substrate supporting member 91 does not rotate (spin).

As described above, the spin process of the wafer W ends.

The predetermined angle θ is preferably determined such that the sum of the spin angles, which occur the predetermined times in the spin process relative to the substrate supporting member 91 until the film thickness of the deposited film reaches a target film thickness, is an integral multiple (n times) of 360°. With this, the wafer W spins n times before the film having the target film thickness is deposited. Therefore, the film thickness of a part having a thick film generated on the surface of the wafer W and the film thickness of apart having a thin film generated on the surface of the wafer W are effectively set off so as to especially improve the film thickness evenness deposited on the wafer W.

Further, the predetermined angle θ is preferably 60° or greater and 120° or smaller from the viewpoint of enabling to reduce the number of times of repeating the spin process and the viewpoint of avoiding an excessive load on the driving unit 23 of revolving the turntable 2 (the revolving shaft 22).

Specifically, for example, in a case where the spin process are performed 4 times until the film thickness of the deposited silicon oxide film reaches a target film thickness, the predetermined angle is preferably 90° (360°/4). Further, for example, in a case where the spin process are performed 12 times until the film thickness of the deposited silicon oxide film reaches a target film thickness, the predetermined angle is preferably 60° (720°/12), 90° (1080°/12), or 120° (1440°/12).

(Carry-Out Process)

By alternately repeating the film deposition processes and the spin processes multiple times, the silicon oxide film having the predetermined film thickness is deposited on the upper surface of the wafer W. Thereafter, the supply of the BTBAS gas and the supply of the $O_3$ gas are stopped, and the revolving of the turntable 2 is stopped. Next, the inside of the vacuum chamber 1 is purged. Subsequently, the wafer W is sequentially carried out of the vacuum chamber 1 using the transfer arm 10 by an operation reverse to the operation in the carry-in process.

According to the above processes, the method of depositing the film of the embodiment is substantialized.

As described above, according to the film deposition apparatus of the embodiment, the wafer W can be spun using force of revolving the turntable 2. Therefore, a drive device for spinning the wafer can be unnecessary. Therefore, the wafer W spins relative to the turntable 2 with a simple structure so as to improve the film thickness evenness of the film deposited on the wafer.

Within the embodiment, although the deposition of the molecular layer of the silicon oxide film has been described within the embodiment, the embodiment is not limited thereto and deposition of a molecular layer of a silicon nitride film can also be performed. A nitride gas used for the deposition of the molecular layer of the silicon nitride film is, for example, ammonia ($NH_3$).

A raw gas for depositing the molecular layer of the silicon oxide film or the molecular layer of the silicon nitride film is not limited to BTBAS. The raw gas is, for example, dichlorosilane (DCS), hexachlorodisilane (HCD), tri(dimethylaminosilane) (3DMAS), and tetraethoxysilane (TEOS).

Further, the film deposition apparatus of the present invention is not limitedly used to deposit the molecular layer of the silicon oxide film or the molecular layer of the silicon nitride film. The film deposition apparatus of the present invention can be used to deposit a molecular layer of aluminum oxide ($Al_2O_3$) using trimethylaluminum (TMA) and either $O_3$ or oxygen plasma, a molecular layer of zirconium oxide ($ZrO_2$) using tetrakis(ethylmethylamino) zirconium (TEMAZ) and either $O_3$ or oxygen plasma, a molecular layer of hafnium oxide ($HfO_2$) using tetrakis (ethylmethylamino)hafnium (TEMAHf) and either $O_3$ or oxygen plasma, a molecular layer of strontium oxide (SrO) using strontiumbis-tetramethylheptanedionato ($Sr(THD)_2$) and either $O_3$ or oxygen plasma, a molecular layer of titanium oxide (TiO) using titaniummethylpentanedionato-bis-tetramethylheptan edionato (Ti(MPD)(THD)) and either $O_3$ or oxygen plasma, and so on.

Because the above film deposition apparatus can spin the substrate using the force of revolving the turntable, the drive device for spinning the substrate is unnecessary. Therefore, the substrate spins relative to the turntable with a simple structure so as to improve the film thickness evenness of the film deposited on the substrate.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the film deposition apparatus has been described in detail, it should be understood that the various changes, substitutions, and alterations could be made hereto without departing from the spirit and scope of the invention.

What is claimed is:

1. A film deposition apparatus for sequentially supplying at least two reaction gases, which mutually react, into a chamber to deposit a film on a substrate, the film deposition apparatus comprising:
   a turntable configured to be rotatable and include a concave portion on an upper surface, a bottom portion of the concave portion having a through hole;
   a substrate supporting member configured to be attachable to and detachable from the concave portion, an upper surface of the substrate supporting member being configured to mount the substrate, a lower surface of the substrate supporting member being configured to have a first protruding portion;
   a drive mechanism configured to move up and down the turntable, and revolve the turntable;
   a lid member located inside the chamber and lower than the turntable, an upper surface of the lid member having a second protruding portion; and
   a control unit configured to, after the drive mechanism moves down the turntable, revolve the turntable to cause the first protruding portion to contact the second protruding portion and cause the substrate supporting member to move to be spun a predetermined angle relative to the turntable.

2. The film deposition apparatus according to claim 1, wherein the control unit controls the drive mechanism to cause the turntable to be moved downward so that the substrate supporting member separates from the concave portion.

3. The film deposition apparatus according to claim 1, wherein the lid member includes a slip seat made of a material having a smaller friction coefficient relative to the first protruding portion, and
   wherein the second protruding portion is provided on the upper surface of the slip seat.

4. The film deposition apparatus according to claim 3, wherein the first protruding portion is made of sapphire or quartz, and
   wherein the slip seat is made of sapphire.

5. The film deposition apparatus according to claim 4, wherein titanium carbide coats a sliding surface between the first protruding portion and the second protruding portion.

6. The film deposition apparatus according to claim 4, wherein titanium carbide coats a sliding surface between the first protruding portion and the slip seat.

7. The film deposition apparatus according to claim 1, the film deposition apparatus further comprising:
   a bearing configured to support the substrate supporting member so that the substrate supporting member is freely rotatable around a revolving shaft of the substrate supporting member,
   wherein the substrate supporting member is mounted on the turntable through the bearing.

8. The film deposition apparatus according to claim 7, wherein a flange portion is shaped like a protrusion, and is provided at a central portion on a lower surface of the substrate supporting member, and
   wherein the bearing includes a part shaped like a circular ring and supports the flange portion so that the flange portion is freely rotatable around the revolving shaft of the substrate supporting member.

9. The film deposition apparatus according to claim 7, wherein the bearing is made of sapphire.

10. The film deposition apparatus according to claim 9, wherein titanium carbide coats a sliding surface between the bearing and the flange portion.

11. The film deposition apparatus according to claim 1, wherein the first protruding portion is provided along a peripheral direction of the supporting member at even intervals, and
    wherein the second protruding portion is provided at a position corresponding to the first protruding portion of the lid member.

12. The film deposition apparatus according to claim 1, the film deposition apparatus further comprising:
    a heating unit provided below the lid member and configured to heat the substrate mounted on the mounting portion.

13. The film deposition apparatus according to claim 1, wherein the first protruding portion is shaped like a cylinder.

14. The film deposition apparatus according to claim 1, wherein the second protruding portion is shaped like a protrusion extending in a radial direction of the lid member.

15. A method of depositing a film by sequentially supplying at least two reaction gases, which mutually react, into a chamber to deposit a film on a substrate, the method comprising:
    a carry-in process of mounting the substrate on a mounting portion of a substrate supporting member, which includes the mounting portion and a substrate supporting member, the substrate supporting member being attachable to and detachable from a concave portion formed on an upper surface of a turntable provided inside a chamber so as to be revolved and having a through hole, the substrate supporting member including the mounting portion of mounting the substrate on an upper surface and a plurality of first protruding portions;
    a film deposition process of revolving the turntable and simultaneously supplying a first reaction gas and a second reaction gas respectively to separated areas, which are separated by a separation area in a peripheral direction of the turntable; and
    a spin process including:
        a step of stopping the supplying of the first reaction gas and the second reaction gas and simultaneously stopping the revolving of the turntable;
        a step of moving down the stopped turntable and causing the first protruding portion to contact a lid member located inside the chamber and lower than the turntable, an upper surface of the lid member having a second protruding portion;
        a step of revolving the turntable to cause the first protruding portion to contact the second protruding portion so as to spin the substrate supporting member relative to the turntable by a predetermined angle; and a step of moving up the turntable after the substrate supporting member is spun relative to the turntable by the predetermined angle.

16. The method of depositing the film according to claim 15, wherein, in the step of moving down the stopped turntable and causing the first protruding portion to contact the lid member, the turntable in moved down so that the substrate supporting member is separated from the concave portion.

17. The method of depositing the film according to claim 15, wherein the film deposition process and the spin process are alternately repeated a plural number of times.

18. The method of depositing the film according to claim 17, wherein a sum of the spin angles, which occur in the spin process until a film thickness of the film reaches a target film thickness, is an integral multiple of 360°.

19. The method of depositing the film according to claim 15, wherein the predetermined angle is 60° or greater and 120° or smaller.

20. A non-transitory computer-readable recording medium storing a program causing a computer to perform a method of depositing a film by sequentially supplying at least two reaction gases, which mutually react, into a chamber to deposit a film on a substrate, the method comprising:
a carry-in process of mounting the substrate on a mounting portion of a substrate supporting member, which includes the mounting portion and a substrate supporting member, the substrate supporting member being attachable to and detachable from a concave portion formed on an upper surface of a turntable provided inside a chamber so as to be revolved and having a through hole, the substrate supporting member including the mounting portion of mounting the substrate on an upper surface and a plurality of first protruding portions;
a film deposition process of revolving the turntable and simultaneously supplying a first reaction gas and a second reaction gas respectively to separated areas, which are separated by a separation area in a peripheral direction of the turntable; and
a spin process including:
a step of stopping the supplying of the first reaction gas and the second reaction gas and simultaneously stopping the revolving of the turntable;
a step of moving down the stopped turntable and causing the first protruding portion to contact a lid member located inside the chamber and lower than the turntable, an upper surface of the lid member having a second protruding portion;
a step of revolving the turntable to cause the first protruding portion to contact the second protruding portion so as to spin the substrate supporting member relative to the turntable by a predetermined angle; and
a step of moving up the turntable after the substrate supporting member is spun relative to the turntable by the predetermined angle.

* * * * *